United States Patent
Lu

(10) Patent No.: US 7,804,692 B2
(45) Date of Patent: Sep. 28, 2010

(54) METHOD AND SYSTEM FOR PLACING MULTIPLE LOADS IN A HIGH-SPEED SYSTEM

(75) Inventor: Huajun Lu, Shenzhen (CN)

(73) Assignee: NVIDIA Corporation, Santa Clara, CA (US)

( * ) Notice: Subject to any disclaimer, the term of this patent is extended or adjusted under 35 U.S.C. 154(b) by 438 days.

(21) Appl. No.: 11/614,846

(22) Filed: Dec. 21, 2006

(65) Prior Publication Data

US 2008/0115965 A1    May 22, 2008

(51) Int. Cl.
H05K 1/18 (2006.01)
(52) U.S. Cl. .................. 361/763; 361/760; 174/255; 174/260
(58) Field of Classification Search ............ 361/763, 361/760; 174/255, 260
See application file for complete search history.

(56) References Cited

U.S. PATENT DOCUMENTS

| | | | | |
|---|---|---|---|---|
| 5,513,135 | A * | 4/1996 | Dell et al. ............... | 365/52 |
| 6,336,269 | B1 * | 1/2002 | Eldridge et al. .......... | 29/885 |
| 6,434,016 | B2 * | 8/2002 | Zeng et al. .............. | 361/760 |
| 6,618,266 | B2 * | 9/2003 | Blakely et al. .......... | 361/763 |
| 6,700,457 | B2 * | 3/2004 | McCall et al. ........... | 333/33 |
| 6,772,262 | B1 | 8/2004 | Park et al. | |
| 6,807,065 | B2 * | 10/2004 | Sato ..................... | 361/780 |
| 6,862,192 | B2 * | 3/2005 | Yashiro ................. | 361/803 |
| 6,978,328 | B1 * | 12/2005 | Osaka et al. ........... | 710/107 |
| 7,030,712 | B2 * | 4/2006 | Brunette et al. ........ | 333/33 |
| 7,045,719 | B1 * | 5/2006 | Alexander et al. ...... | 174/262 |
| 7,113,418 | B2 * | 9/2006 | Oberlin et al. ......... | 365/63 |
| 7,149,666 | B2 * | 12/2006 | Tsang et al. ............ | 703/2 |
| 7,260,691 | B2 * | 8/2007 | Bains .................... | 711/154 |
| 7,269,521 | B2 * | 9/2007 | Hsu et al. .............. | 702/57 |

(Continued)

FOREIGN PATENT DOCUMENTS

CN    1329363 A    4/2001

(Continued)

OTHER PUBLICATIONS

Hall, et al. "High-Speed Digital System Design—A Handbook of Interconnect Theory and Design Practices" a handbook of interconnect theory and design practices p. cm., John Wiley & Sons, Inc., 2000, Chapters 2.4-6.1.6.

(Continued)

Primary Examiner—Tuan T Dinh
Assistant Examiner—Xiaoliang Chen
(74) Attorney, Agent, or Firm—Patterson & Sheridan, LLP

(57) ABSTRACT

A method and system for placing multiple loads in a high-speed system are disclosed. In one embodiment, the first load and the second load are placed on the first side and the second side of the printed circuit board, respectively. In addition, the first signal pin of the first load is vertically aligned with the second signal pin of the second load with an offset; the terminating end of a trace, which is connected to a driver on the printed circuit board, the first signal pin, and the second signal pin are connected at a T-point. The printed circuit also includes the first decoupling capacitor on the second side and the second decoupling capacitor on the first side. The first decoupling capacitor is connected to the first power pin of the first load. Similarly, the second decoupling capacitor is connected to a second power pin of the second load.

5 Claims, 5 Drawing Sheets

U.S. PATENT DOCUMENTS

| | | | | |
|---|---|---|---|---|
| 7,271,348 | B1 * | 9/2007 | Fan et al. | 174/260 |
| 7,326,858 | B2 * | 2/2008 | Lee et al. | 174/260 |
| 7,365,438 | B2 * | 4/2008 | Hedler et al. | 257/778 |
| 7,390,973 | B2 * | 6/2008 | Yoon et al. | 174/260 |
| 2004/0012938 | A1 * | 1/2004 | Sylvester et al. | 361/794 |

OTHER PUBLICATIONS

David L. Jones "PCB Design Tutorial" www.alternatezone.com, Jun. 29, 2004, pp. 1-25.

Translated Chinese Office Action, Chinese App. No. 200610150521.0, dated Jun. 26, 2009.

* cited by examiner

METHOD AND SYSTEM FOR PLACING MULTIPLE LOADS IN A HIGH-SPEED SYSTEM

CROSS-REFERENCE TO RELATED APPLICATIONS

The current application claims the benefit of the application titled, "A Method and System for Placing Multiple Loads in a High-Speed System," filed in China on Oct. 16, 2006 and having application number 200610150521.0 This related application is incorporated herein by reference in its entirety.

BACKGROUND OF THE INVENTION

1. Field of the Invention

Embodiments of the present invention relate generally to digital designs and more specifically to a method and system for placing multiple loads in a high-speed system.

2. Description of the Related Art

Unless otherwise indicated herein, the approaches described in this section are not prior art to the claims in this application and are not admitted to be prior art by inclusion in this section.

A printed circuit board ("PCB") is commonly used to provide a mechanical structure on which discrete electronic components, such as integrated circuits, resistors, capacitors and the like, are mounted and interconnected. The interconnections in a PCB are provided by layers of patterned traces of metal, typically copper, on and in the PCB. Each of these interconnections has a device that is changing the state, or the signal, on the interconnection, herein referred to as a driver, and a device that is reading the signal from the interconnection, herein referred to as a receiver or a load. In high-speed system designs, instead of modeling the behavior of the interconnections as lumped capacitors or simple delay lines, the interconnections are modeled as transmission lines to properly characterize the timing issues associated with the decreasing timing budgets allotted for the interconnections.

Some of the issues relating to signal integrity in high-speed system designs include the reflections along the interconnections and the noises associated with power distribution. To illustrate, FIG. 1A and FIG. 1B are simplified layouts of printed circuit boards with multi-loads in high-speed systems. Specifically, the system In FIG. 1A, 100, includes PCB 102, driver 108, load a 104, and load b 106. Signal pin 122 of driver 108, signal pin 112 of load a 104, and signal pin 118 of load b 106 are connected to trace 124. Driver 108 drives a signal, $V_{initial}$, via signal pin 122 onto trace 124, and the signal propagates towards the two loads. Because of the split at T-point 126 and the daisy-chaining of load a 104 and load b 106, the integrity of the signal on trace 124, especially the signal arriving at signal pin 118, is negatively impacted. In particular, since trace 124 in effect terminates at load a 104, which most likely does not have the matching characteristic impedance of trace 124, a portion of $V_{initial}$, also referred to as $V_{reflected}$, reflects back down trace 124 toward driver 108. Then driver 108 may reflect yet another portion of $V_{reflected}$ back toward load a 104. This reflecting and counter-reflecting process generally continues until steady state is reached on trace 124. Because these initial, reflected, and counter-reflected signals all travel on the same path and interfere with one another, the integrity of the intended signal on trace 124, $V_{initial}$, is severely degraded.

Unlike the placement of the loads illustrated in FIG. 1A, in FIG. 1B, load c 154 and load d 156 are placed on both sides of PCB 152 in system 150. Although the physical distance between these two loads may be shorter than the distance between load a 104 and load b 106 shown in FIG. 1A, system 150 is still subject to various signal integrity problems. In particular, the introduction of stubs 178 and 180, which respectively connecting signal pin 162 of load c 154 and signal pin 168 of load d 156 to T-point 176 via paths of some lengths, causes non-uniformity of the characteristic impedance of trace 174. This in turn negatively impacted the integrity of the signal traveling on trace 174. In addition, the aforementioned reflection problem also exists in this system, because the impedance of the terminating load c 154 and load d 156 is unlikely to match the impedance of trace 174, which may be non-uniformed as mentioned above. Furthermore, because decoupling capacitors 164 and 170 are positioned away from power pins 160 and 166, respectively, the intended effect of the decoupling capacitance to reduce noise in the power distribution of PCB 152 is significantly diminished.

As the foregoing illustrates, what is needed is a way to place multiple loads in a high-speed system so that the signal integrity of the system is maintained.

SUMMARY OF THE INVENTION

A method and system for placing multiple loads in a high-speed system are disclosed. In one embodiment, the first load and the second load are placed on the first side and the second side of the printed circuit board, respectively. In addition, the first signal pin of the first load is vertically aligned with the second signal pin of the second load with an offset; the terminating end of a trace, which is connected to a driver on the printed circuit board, the first signal pin, and the second signal pin are connected at a T-point. The printed circuit also includes the first decoupling capacitor on the second side and the second decoupling capacitor on the first side. The first decoupling capacitor is connected to the first power pin of the first load. Similarly, the second decoupling capacitor is connected to a second power pin of the second load.

One advantage of the disclosed method and system is that they provide a way to shorten the lengths of the stubs between the loads and the trace and also shorten the distances between the loads and the decoupling capacitors on a printed circuit board. Such a disclosed method and system improve the signal integrity and the decoupling effects in a high-speed system.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

A method and system for placing multiple loads in a high-speed system are described. In the following description, for the purposes of explanation, numerous specific details are set forth in order to provide a thorough understanding of the present invention. It will be apparent, however, to one skilled in the art that the present invention may be practiced without these specific details.

Figure 2A:
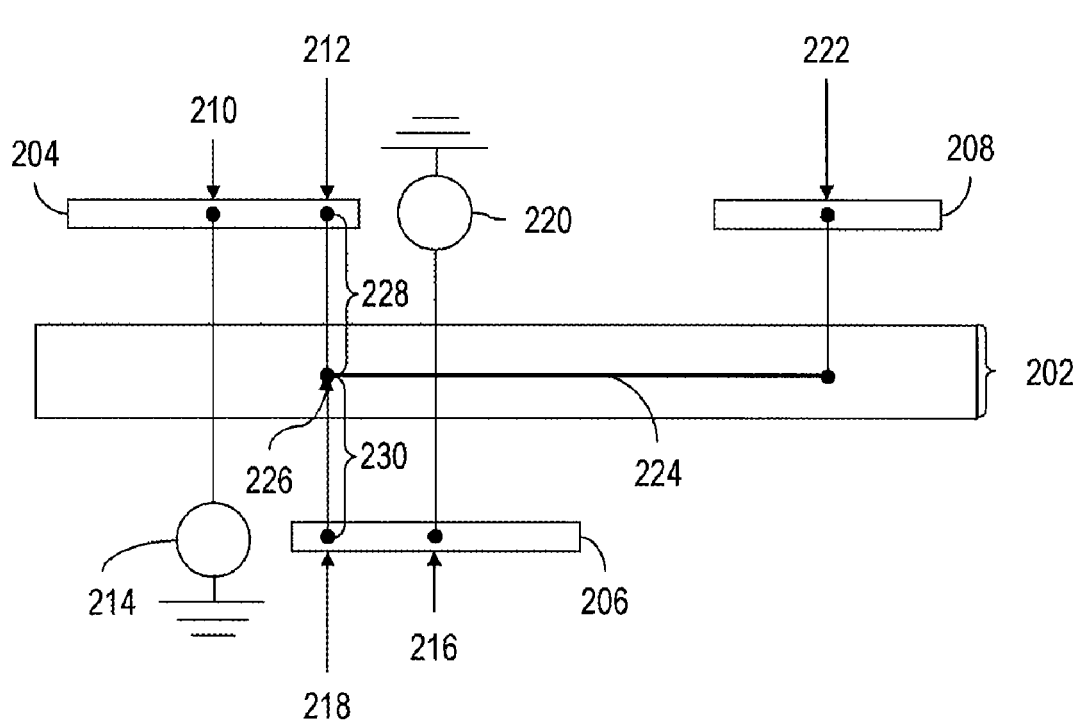
FIG. 2A is a simplified layout of a printed circuit board, including a driver and multiple loads, according to one embodiment of the present invention.

FIG. 2A is a simplified layout of a printed circuit board, including a driver and multiple loads, according to one embodiment of the present invention. Specifically, system 200 includes PCB 202, load a 204, load b 206, and driver 208. Some examples of a load include, without limitation, a memory device or any device that is capable of receiving signals and using the received signals. Some examples of a driver include, without limitation, a general purpose processing unit, a special purpose processing unit, a clock signal generator, or any device that is capable of generating and driving a signal onto an interconnection, such as trace 224. Although a particular number of drivers and loads are illustrated in FIG. 2A, it should be apparent to a person with ordinary skill in the art to implement system 200 with a different number of drivers and loads without exceeding the scope of the claimed invention.

Figure 1A:
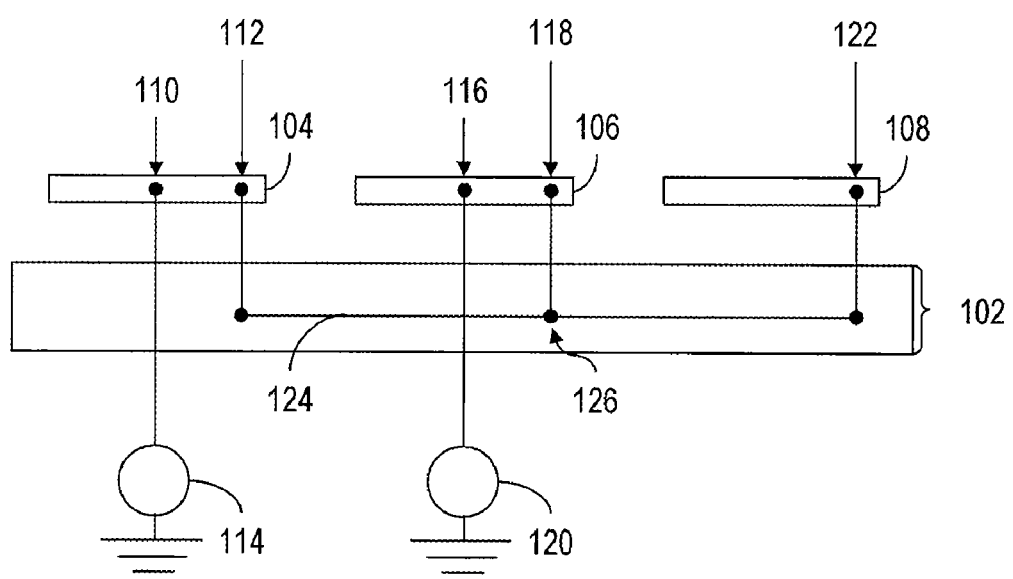
FIG. 1A is a simplified prior art layout of a printed circuit board, including a driver and multiple loads.
Figure 1B:
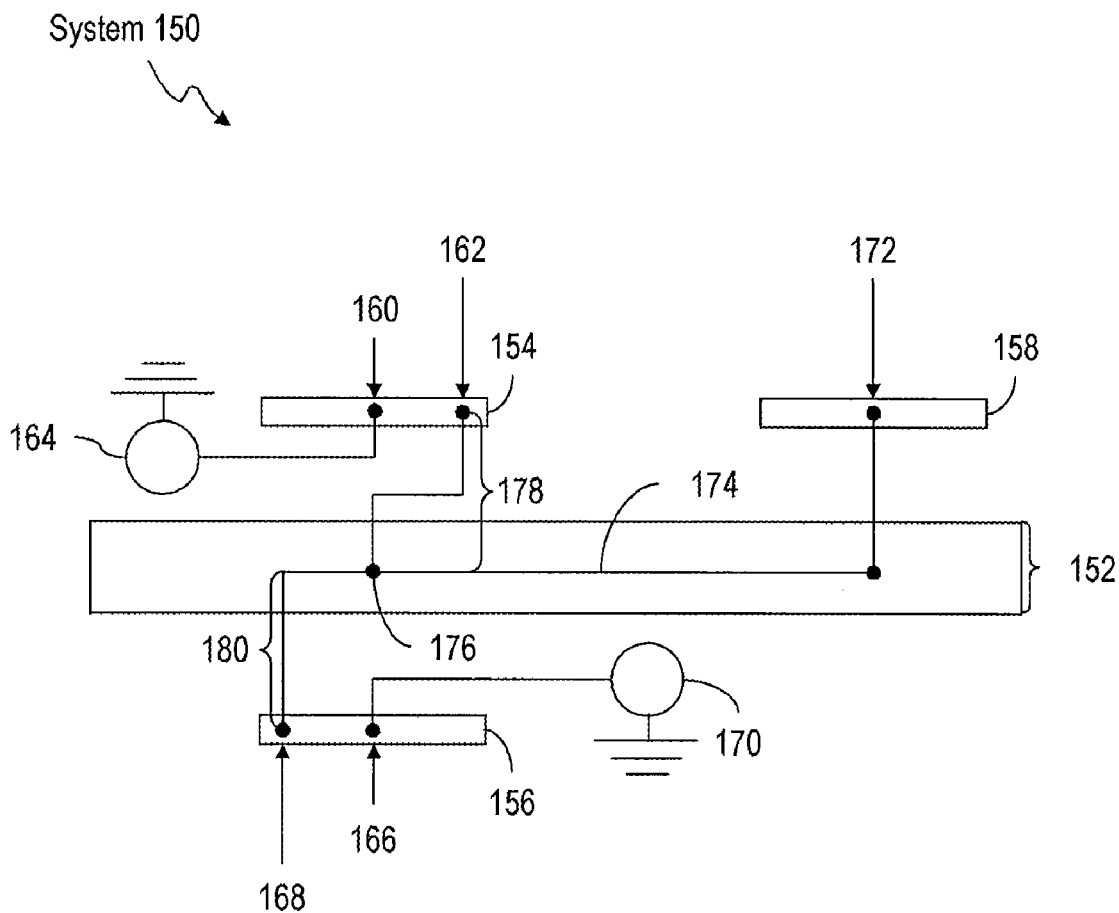
FIG. 1B is another simplified prior art layout of a printed circuit board, including a driver and multiple loads.
Figure 2B:
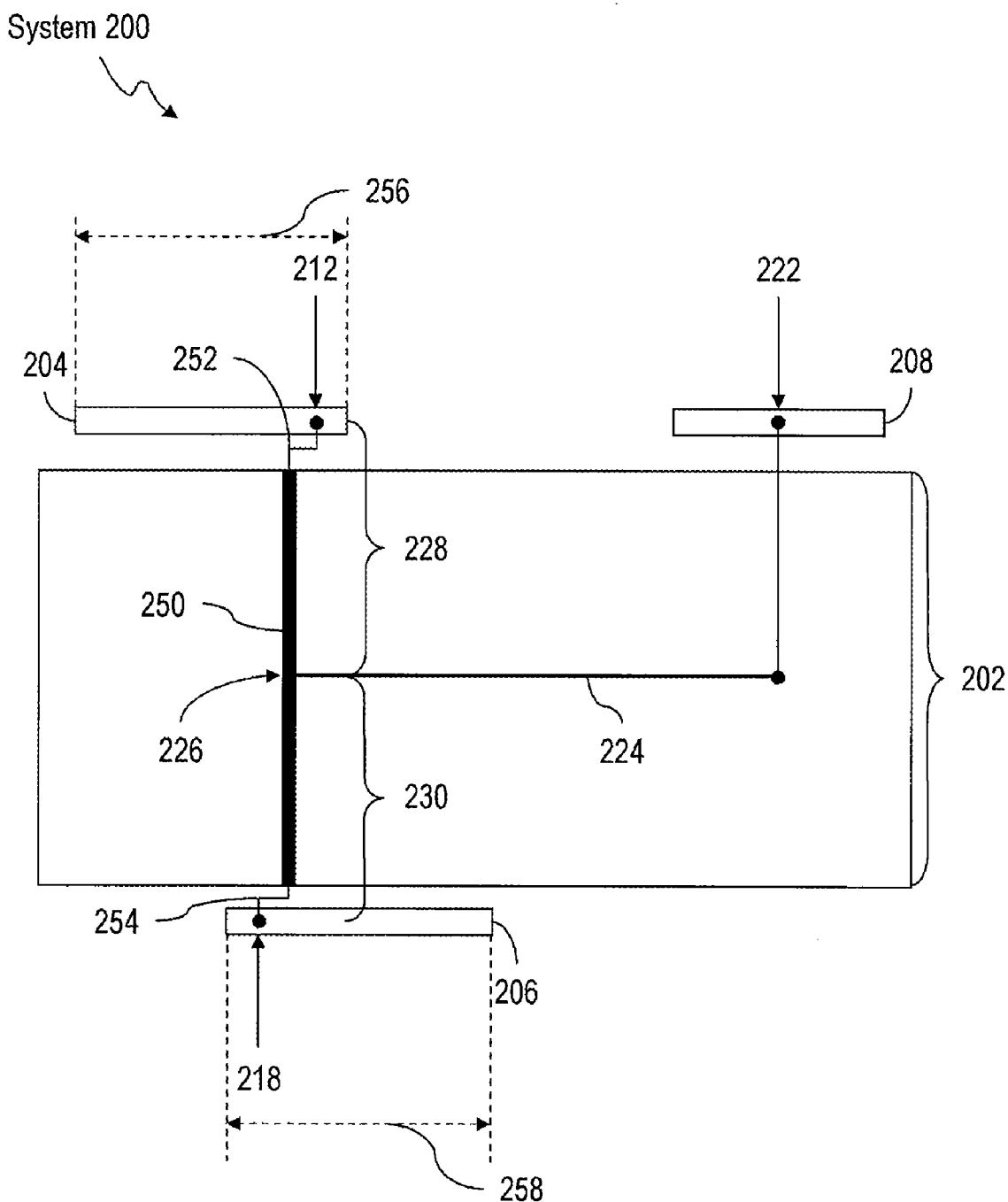
FIG. 2B is an exploded view of one way to utilize a via in a printed circuit board with a driver and multiple loads, according to one embodiment of the present invention.
Figure 2C:
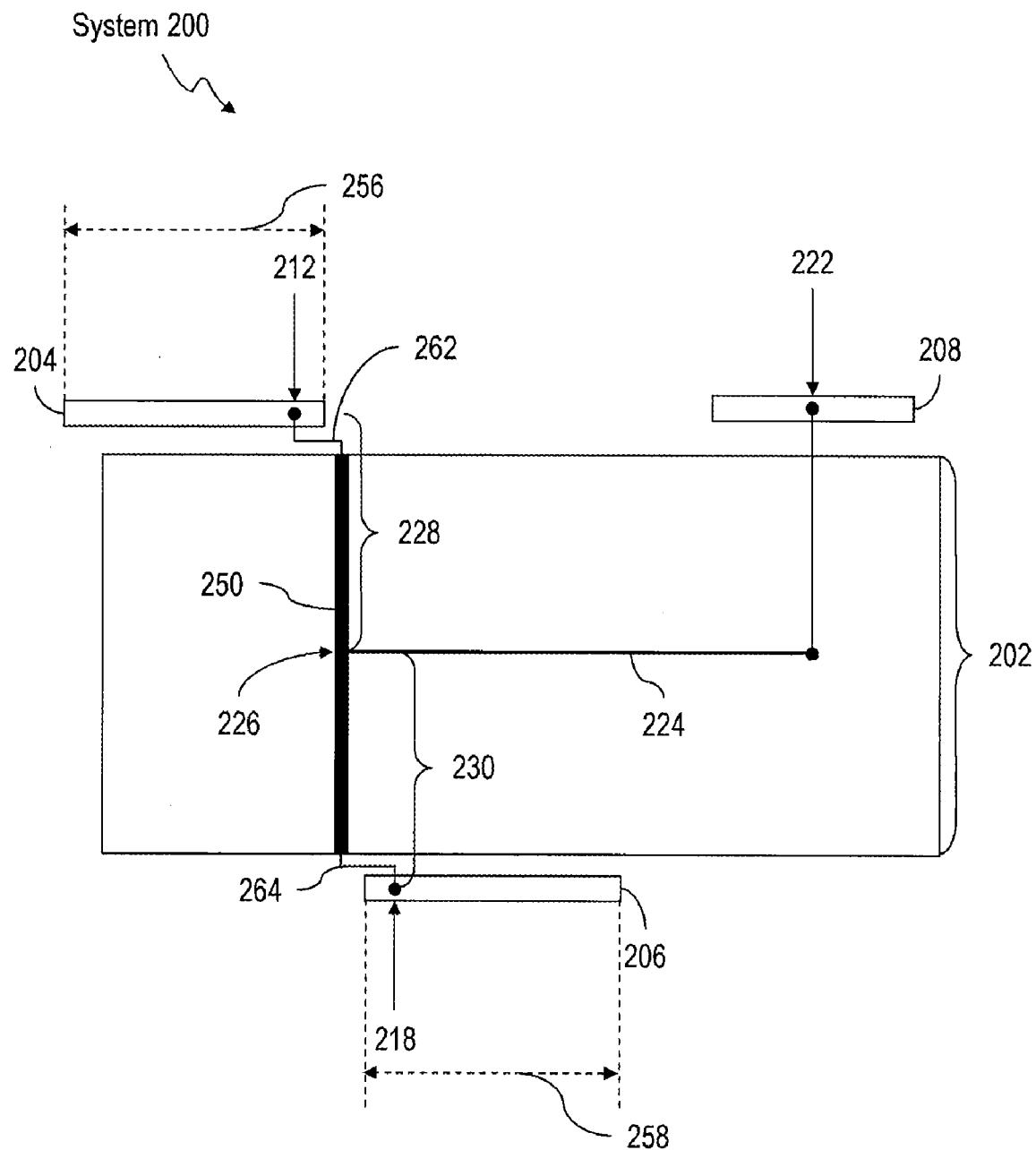
FIG. 2C is an exploded view of an alternative way to utilize a via in a printed circuit board with a driver and multiple loads, according to one embodiment of the present invention.

In system 200, load a 204 and load b 206 are placed on both sides of PCB 202; signal pin 212 connects to T-point 226 (this connection is also referred to as stub 228), and signal pin 218 also connects to T-point 226 (this connection is also referred to as stub 230. Moreover, T-point 226 is at the end of trace 224. In one implementation, vias, are utilized to connect the signal pins 212 and 218 with T-point 226. Vias are electronically plated holes that allow electrical connections among different layers on a PCB. FIG. 2B is an exploded view of one way to utilize via 250 in system 200. It should be noted that a via, such as via 250, is typically not customized to be directly underneath a signal pin of a particular device. Thus, trace 252 is utilized to connect signal pin 212 to via 250, and trace 254 is utilized to connect signal pin 218 also to via 250. FIG. 2C is an exploded view of an alternative way to utilize via 250 in system 200. Specifically, via 250 in this layout is neither directly underneath load a 204 nor directly underneath load b 206. Trace 262 is utilized to connect signal pin 212 to via 250, and trace 264 is utilized to connect signal pin 218 also to via 250. According to these configurations shown in FIG. 2A, FIG. 2B, and FIG. 2C, signal pins 212 and 218 are essentially vertically aligned, with the combined lengths of the traces connecting signal pins 212 and 218 to via 250 as an offset. Even with the offset, the lengths of stub 228 and stub 230 are significantly shortened and thus reducing the possible effects of impedance non-uniformity as discussed above. It should be apparent to one with ordinary skill in the art to recognize that FIG. 2A, FIG. 2B, and FIG. 2C are not drawn to scale, and the offset shown in FIG. 2B and FIG. 2C is substantially shorter than the length of load a 204 (i.e., 256) or the length of load b 206 (i.e., 258). For instance, the length of the offset may be approximately 0.55 millimeter, and the length of a load may be approximately 12 millimeters. In other words, in this example, the length of the offset is approximately 4.6% (i.e., 0.55 divided by 12) of the length of the load. Also, because signal pins 212 and 218 connect to the end of trace 224, the undesirable effects of any possible reflections are significantly diminished. Furthermore, unlike the positioning of the decoupling capacitors shown in FIG. 1A and FIG. 1B, decoupling capacitors 200 and 214 are positioned directly opposite of power pins 216 and 210, respectively. Given the proximity of the decoupling capacitors to the loads, the decoupling effects of abating power-grid noises can be maximized.

The above description illustrates various embodiments of the present invention along with examples of how aspects of the present invention may be implemented. The above examples, embodiments, and drawings should not be deemed to be the only embodiments, and are presented to illustrate the flexibility and advantages of the present invention as defined by the following claims.

I claim:

1. A high-speed system, comprising:
    a printed circuit board,
    a first load with a first signal pin and a first power pin on a first side of the printed circuit board,
    a second load with a second signal pin and a second power pin on a second side of the printed circuit board,
    a driver coupled to a trace,
    wherein the first load and the second load are positioned such that the first signal pin is vertically aligned to the second signal pin with an offset,
    wherein the offset is substantially shorter than the length of the first load,
    wherein a through via connects a terminating end of the trace at the middle of the through via, the first signal pin on one end of the through via, and the second signal pin on the other end of the through via,
    wherein the through via is disposed neither directly underneath the first load nor directly underneath the second load,
    wherein the offset corresponds to a sum of a first distance between the first signal pin and the through via and a second distance between the second signal pin and the through via,
    wherein a first trace on surface of the first side of the printed circuit board that traverses the first distance couples the first signal pin to the one end of the through via, and
    wherein a second trace on surface of the second side of the printed circuit board that traverses the second distance couples the second signal pin to the other end of the through via;
    a first decoupling capacitor on the second side of the printed circuit board is directly connected to the first power pin; and
    a second decoupling capacitor on the first side of the printed circuit board is directly connected to the second power pin.

2. The high-speed system of claim 1, wherein the distances between the first decoupling capacitor and the first load and between the second decoupling capacitor and the second load are minimized.

3. The high-speed system of claim 2, wherein the connection between the first decoupling capacitor and the first power pin is substantially perpendicular to the first load.

4. The high-speed system of claim 2, wherein the connection between the second decoupling capacitor and the second power pin is substantially perpendicular to the second load.

5. The high-speed system of claim 1, wherein the placement of the first load and the second load on the printed circuit board results in the minimization of the length of a first stub including the distance between the first signal pin and the T-point and the length of a second stub including the distance between the second signal pin and the T-point.

* * * * *

UNITED STATES PATENT AND TRADEMARK OFFICE
CERTIFICATE OF CORRECTION

PATENT NO. : 7,804,692 B2  
APPLICATION NO. : 11/614846  
DATED : September 28, 2010  
INVENTOR(S) : Huajun Lu Page 1 of 1

It is certified that error appears in the above-identified patent and that said Letters Patent is hereby corrected as shown below:

Title Page, item (30) Foreign Application Priority Data should read as follows:

December 16, 2006 (CN)................................200610150521.0

Signed and Sealed this  
Seventeenth Day of May, 2011

David J. Kappos  
*Director of the United States Patent and Trademark Office*